(12) United States Patent
Mitsuiki et al.

(10) Patent No.: US 8,492,227 B2
(45) Date of Patent: Jul. 23, 2013

(54) METHOD OF FORMING SIDE WALL SPACERS FOR A SEMICONDUCTOR DEVICE

(75) Inventors: Akira Mitsuiki, Kanagawa (JP); Atsuro Inada, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 355 days.

(21) Appl. No.: 12/837,901

(22) Filed: Jul. 16, 2010

(65) Prior Publication Data

US 2011/0053367 A1    Mar. 3, 2011

(30) Foreign Application Priority Data

Aug. 28, 2009    (JP) .................................. 2009-197858

(51) Int. Cl.
*H01L 21/8234* (2006.01)
*H01L 21/311* (2006.01)

(52) U.S. Cl.
USPC ..... 438/275; 438/696; 438/703; 257/E21.626

(58) Field of Classification Search
USPC .................. 438/696, 703, 275; 257/E21.626, 257/E21.64

See application file for complete search history.

(56) References Cited

U.S. PATENT DOCUMENTS

| 7,118,972 B2 | 10/2006 | Shinohara et al. | |
| 2004/0092074 A1* | 5/2004 | Mao et al. | 438/305 |
| 2009/0186471 A1* | 7/2009 | Jung et al. | 438/527 |

FOREIGN PATENT DOCUMENTS

| JP | 2004-349680 A | 12/2004 |
| JP | 2005-5508 A | 1/2005 |

* cited by examiner

*Primary Examiner* — Daniel Luke
(74) *Attorney, Agent, or Firm* — Foley & Lardner LLP

(57) ABSTRACT

An etching stopper film is formed over a first insulating film. Then, a second insulating film is formed with a thickness that allows concave and convex portions formed due to a first gate electrode to remain. Then, anisotropic etching is performed using the etching stopper film as a stopper to remove the second insulating film over a second gate electrode and form a first side wall spacer of the first gate electrode. Then, the etching stopper film is removed. Then, anisotropic etching is performed on the first insulating film to form a second side wall spacer over the second gate electrode and form a third side wall spacer which is disposed inside the first side wall spacer over the first gate electrode.

5 Claims, 8 Drawing Sheets

METHOD OF FORMING SIDE WALL SPACERS FOR A SEMICONDUCTOR DEVICE

This application is based on Japanese patent application No. 2009-197858, the content of which is incorporated hereinto by reference.

BACKGROUND

1. Technical Field

The present invention relates to a method of manufacturing a semiconductor device that includes two transistors having side wall spacers with different widths.

2. Related Art

In recent years, a system LSI has been used in which a series of functions are integrated into one semiconductor device. In many cases, a logic unit and a memory, such as a SRAM or a DRAM are provided in the semiconductor device.

In the semiconductor device, the gate side wall spacers of the logic unit and the DRAM have the same structure. However, with the miniaturization of elements, it has been difficult to meet the required characteristics in the same side wall spacer structure. Therefore, it is necessary to form the side wall spacers with different widths in the logic unit and the DRAM.

For example, Japanese Unexamined patent publication NO. 2005-005508 discloses a method of manufacturing a semiconductor device shown in FIGS. 9 to 16. First, as shown in FIG. 9, a first gate electrode 3a and a second gate electrode 3b are formed on a silicon substrate 1 having an element isolation oxide film 2 formed thereon. Then, a silicon oxide film 4 serving as a first etching stopper layer, a silicon nitride film 5 serving as a second etching stopper layer, and a silicon oxide film serving as a first side wall spacer layer 6 are sequentially formed thereon.

Then, as shown in FIG. 10, the entire surface of the first side wall spacer layer 6 is etched back by an anisotropic etching method such as a dry etching method. In this case, the etching conditions have high selectivity with respect to the silicon nitride film 5. Therefore, the silicon nitride film 5 remains and the silicon oxide film 4 is protected.

Then, as shown in FIG. 11, a photoresist film 7 is formed, and a groove is formed in the photoresist film 7 to expose the gate electrode 3b and the periphery thereof.

Then, as shown in FIG. 12, the first side wall spacer layer 6 formed on the side surface of the gate electrode 3b is removed by wet etching.

Then, as shown in FIG. 13, the photoresist film 7 is removed by an ashing apparatus or a wet etching apparatus.

Then, as shown in FIG. 14, the silicon nitride film 5, which is the second etching stopper layer, is removed by dry etching or wet etching. This etching is performed under the conditions that have high selectivity with respect to the silicon oxide film 4.

Then, as shown in FIG. 15, a silicon oxide film 8 is formed. Then, as shown in FIG. 16, anisotropic etching, such as dry etching, is performed on the silicon oxide film 8 to form a side wall spacer layer. Side wall spacers with different widths can be formed on the gate electrodes 3a and 3b by the above-mentioned processes.

Japanese Unexamined patent publication NO. 2004-349680 discloses a semiconductor device which includes a first field effect transistor forming a non-volatile memory cell and a second field effect transistor forming a circuit and in which the side wall spacers in the first field effect transistor and the second field effect transistor have different widths. Specifically, a laminated film of a silicon oxide film, a silicon nitride film, and a silicon oxide film formed in this order is formed on a gate electrode of the first field effect transistor and a gate electrode of the second field effect transistor. Then, etching is performed using the silicon nitride film as an etching stopper to selectively remove the uppermost silicon oxide film from the gate electrode of the second field effect transistor. Then, etching is performed on the laminated film to form a side wall spacer.

The present inventor has recognized as follows. In the techniques disclosed in Japanese Unexamined patent publication NOs. 2005-005508 and 2004-349680, anisotropic etching, that is, dry etching is performed on the laminated film, with the etching stopper, which is the silicon nitride film, left, to form the side wall spacer. Therefore, when the etching stopper film is removed, a predetermined amount of silicon oxide film forming a main portion of the side wall spacer with a large width is removed. Therefore, it is difficult to form the side wall spacers with significantly different widths.

SUMMARY

In one embodiment, there is provided a method of manufacturing a semiconductor device. The method includes: forming a first gate electrode of a first transistor and a second gate electrode of a second transistor over a semiconductor substrate; forming a first insulating film with a thickness that allows concave and convex portions formed due to the first gate electrode and the second gate electrode to remain, over the semiconductor substrate, the first gate electrode, and the second gate electrode; forming over the first insulating film an etching stopper film that covers the second gate electrode, but does not cover the first gate electrode; forming a second insulating film with a thickness that allows concave and convex portions formed due to the first gate electrode to remain, over the first insulating film and the etching stopper film; performing anisotropic etching using the etching stopper film as a stopper to remove the second insulating film over the second gate electrode and form a first side wall spacer of the first transistor; removing the etching stopper film; and performing anisotropic etching on the first insulating film to form a second side wall spacer over the second gate electrode and form a third side wall spacer which is disposed inside the first side wall spacer over the first gate electrode.

According to the embodiment, the side wall spacer of the first gate electrode includes the first side wall spacer and the third side wall spacer, and the side wall spacer of the second gate electrode includes the second side wall spacer. Since the etching stopper film does not form the side wall, it is possible to use isotropic etching to remove the etching stopper film. Therefore, when the etching stopper film is removed, it is possible to prevent the first side wall spacer from being removed. Therefore, it is possible to make the width of the side wall spacer of the first gate electrode significantly different from that of the side wall spacer of the second gate electrode.

According to the embodiment, it is possible to form two transistors including side wall spacers with significantly different widths.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

Figure 1:
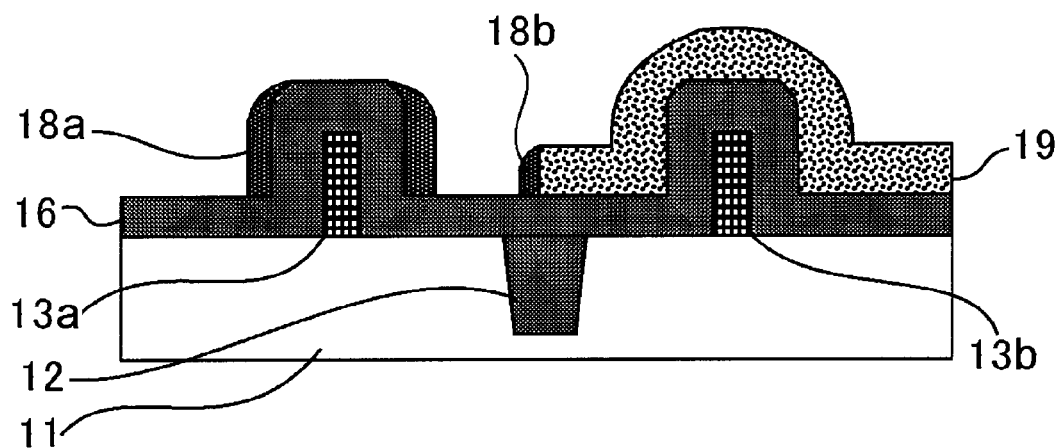
FIG. 1 is a cross-sectional view illustrating a method of manufacturing a semiconductor device according to an embodiment of the invention and shows a process subsequent to FIG. 6.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, exemplary embodiments of the invention will be described with reference to the accompanying drawings. In the drawings, the same components are denoted by the same reference numerals and a description thereof will not be repeated.

FIGS. 1 to 8 are cross-sectional views illustrating a method of manufacturing a semiconductor device according to an embodiment of the invention. In the method of manufacturing the semiconductor device, first, a first gate electrode 13a of a first transistor and a second gate electrode 13b of a second transistor are formed on a semiconductor substrate 11. Then, a first insulating film 16 is formed with a thickness that allows concave and convex portions formed due to the first gate electrode 13a and the second gate electrode 13b to remain, on the semiconductor substrate 11, the first gate electrode 13a, and the second gate electrode 13b. Then, an etching stopper film 19 is formed on the first insulating film 16. The etching stopper film 19 covers the second gate electrode 13b, but does not cover the first gate electrode 13a. Then, a second insulating film 18 is formed with a thickness that allows concave and convex portions formed due to the first gate electrode 13a to remain, on the first insulating film 16 and the etching stopper film 19. Then, anisotropic etching is performed using the etching stopper film 19 as a stopper to remove the second insulating film 18 on the second gate electrode 13b and form a first side wall spacer 18a of the first gate electrode 13a. Then, the etching stopper film 19 is removed. Then, anisotropic etching is performed on the first insulating film 16 to form a second side wall spacer 16b on the second gate electrode 13b and form a third side wall spacer 16a, which is disposed inside the first side wall spacer 18a, on the first gate electrode 13a. Next, the manufacturing method will be described in detail.

Figure 2:
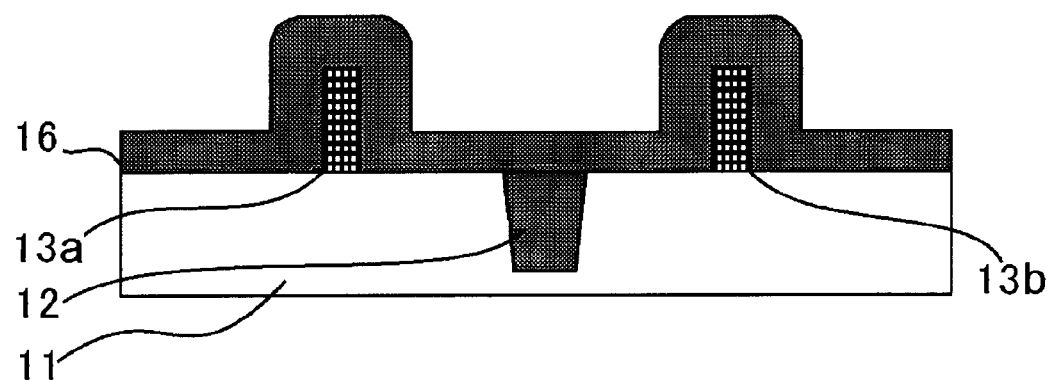
FIG. 2 is a cross-sectional view illustrating the method of manufacturing the semiconductor device according to the embodiment.

First, as shown in FIG. 2, an element isolation film 12 is formed on the semiconductor substrate 11 such as a silicon substrate. The element isolation film 12 is formed by, for example, a shallow trench isolation (STI) method. In this way, a region in which the first transistor is formed and a region in which the second transistor is formed are isolated from other regions.

The semiconductor device manufactured in this embodiment includes a memory area and a logic area. A memory element, such as a DRAM or an SRAM, and a peripheral circuit for reading or writing data from or to the memory element are formed in the memory area. A logic circuit for processing information stored in the memory element is formed in the logic area. The first transistor is used in the peripheral circuit in the memory area, and the second transistor is used in the logic circuit.

Then, a gate insulating film (not shown) is formed on the semiconductor substrate 11, and the first gate electrode 13a and the second gate electrode 13b are formed on the gate insulating film. Then, the first insulating film 16 is formed on the semiconductor substrate 11, the first gate electrode 13a, and the second gate electrode 13b. The first insulating film 16 is formed with a thickness that allows the concave and convex portions formed due to the first gate electrode 13a and the second gate electrode 13b to remain. For example, the thickness of the first insulating film 16 is less than that of the first gate electrode 13a and the second gate electrode 13b. Preferably, the thickness of the first insulating film 16 is equal to or more than one-tenth of the thickness of the first gate electrode 13a and the second gate electrode 13b and equal to or less than half of the thickness thereof. The first insulating film 16 is, for example, a silicon oxide film.

Figure 3:
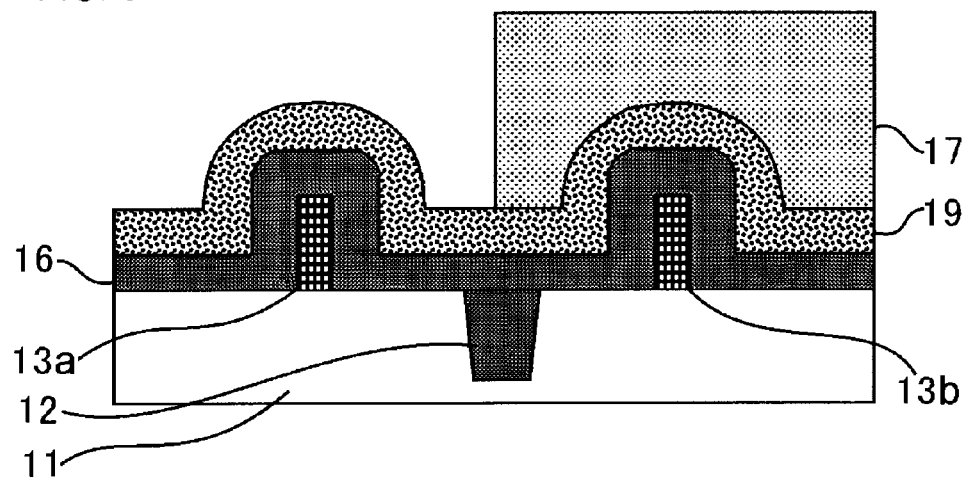
FIG. 3 is a cross-sectional view illustrating a process subsequent to FIG. 2.

Then, as shown in FIG. 3, the etching stopper film 19 is formed on the first insulating film 16. The etching stopper film 19 is made of a material that has etching selectivity with respect to the second insulating film 18, which will be described in detail below. The etching stopper film 19 is, for example, a silicon film, an amorphous carbon film, or a resist film. For example, the thickness of the etching stopper film 19 is equal to or more than one-tenth of the thickness of the first gate electrode 13a and the second gate electrode 13b and equal to or less than half of the thickness thereof.

Then, a resist film is formed on the etching stopper film 19, and the resist film is exposed and developed. In this way, a resist pattern 17 is formed on the etching stopper film 19.

Figure 4:
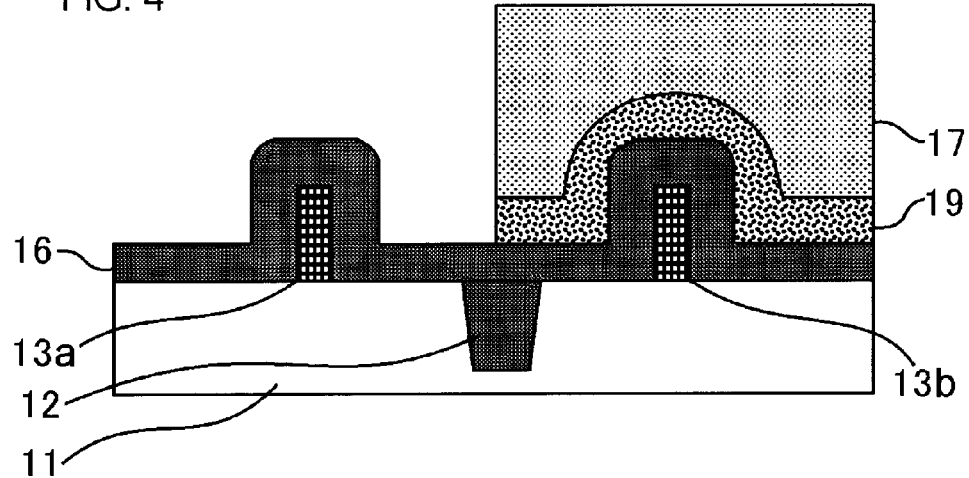
FIG. 4 is a cross-sectional view illustrating a process subsequent to FIG. 3.
Figure 5:
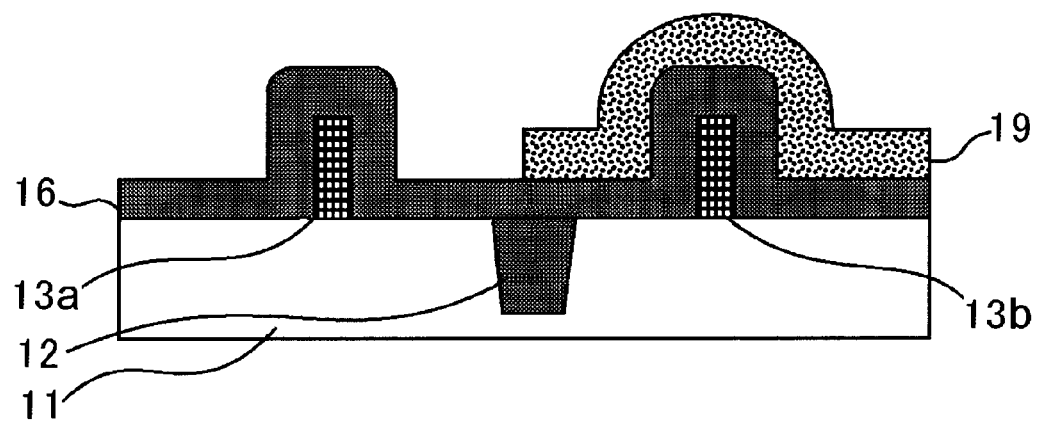
FIG. 5 is a cross-sectional view illustrating a process subsequent to FIG. 4.

Then, as shown in FIG. 4, the etching stopper film 19 is etched using the resist pattern 17 as a mask. In this way, the etching stopper film 19 covers the second gate electrode 13b, but does not cover the first gate electrode 13a. Then, as shown in FIG. 5, the resist pattern 17 is removed. In this state, a portion of the first insulating film 16 on the first gate electrode 13a is exposed. In this state, the inclination of the surface of the etching stopper film 19 covering the side surface of the second gate electrode 13b is lower than that of the surface of the first insulating film 16 covering the side wall of the first gate electrode 13a.

Figure 6:
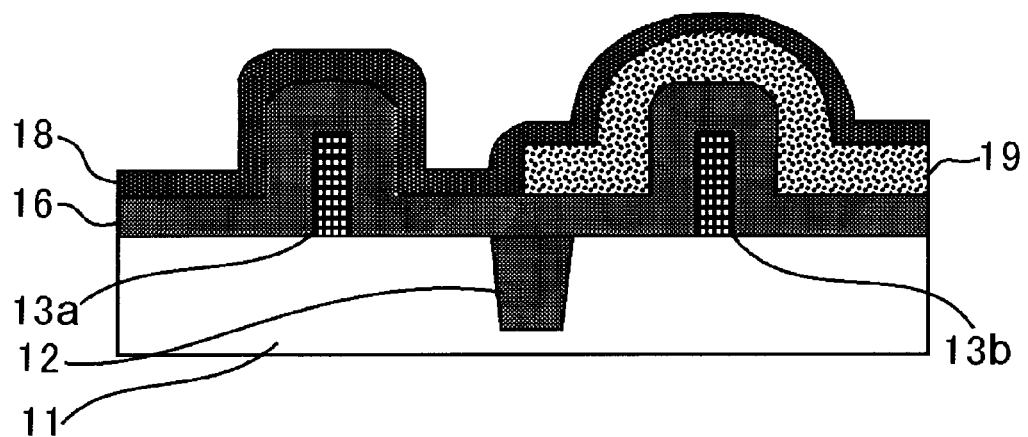
FIG. 6 is a cross-sectional view illustrating a process subsequent to FIG. 5.

Then, as shown in FIG. 6, the second insulating film 18 is formed on the first insulating film 16 and the etching stopper film 19. It is preferable that the second insulating film 18 be made of the same material as that forming the first insulating film 16. When the first insulating film 16 is a silicon oxide film, the second insulating film 18 is a silicon oxide film. For example, the thickness of the second insulating film 18 is equal to or more than one-tenth of the thickness of the first gate electrode 13a and the second gate electrode 13b and equal to or less than half of the thickness thereof.

Figure 7:
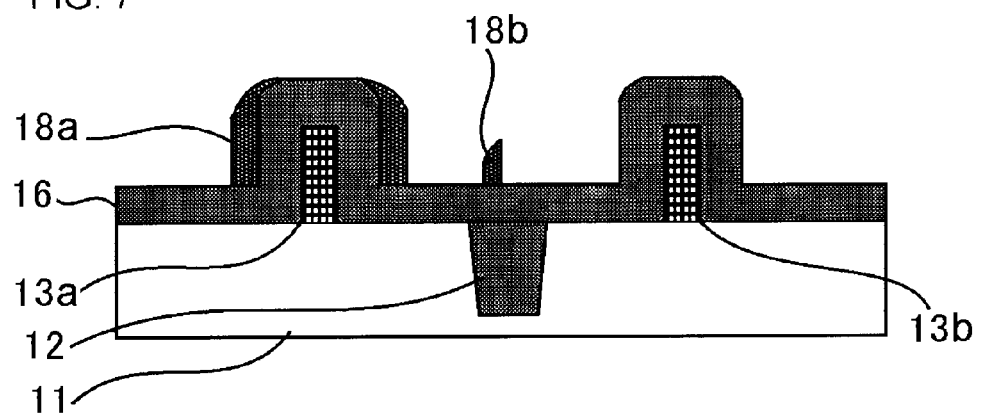
FIG. 7 is a cross-sectional view illustrating a process subsequent to FIG. 1.

Then, as shown in FIG. 1, anisotropic etching is performed on the second insulating film 18 using the etching stopper film 19 as a stopper to etch back the second insulating film 18. As described above, the inclination of the surface of the etching stopper film 19 covering the side surface of the second gate electrode 13b is lower than that of the surface of the first insulating film 16 covering the side wall of the first gate electrode 13a. Therefore, the second insulating film 18 on the second gate electrode 13b is removed. In addition, the first side wall spacer 18a is formed on the side wall of a convex portion of the first insulating film 16 caused by the first gate electrode 13a. A side wall spacer 18b is formed on the side wall of the etching stopper film 19. Then, as shown in FIG. 7, the etching stopper film 19 is removed.

Figure 8:
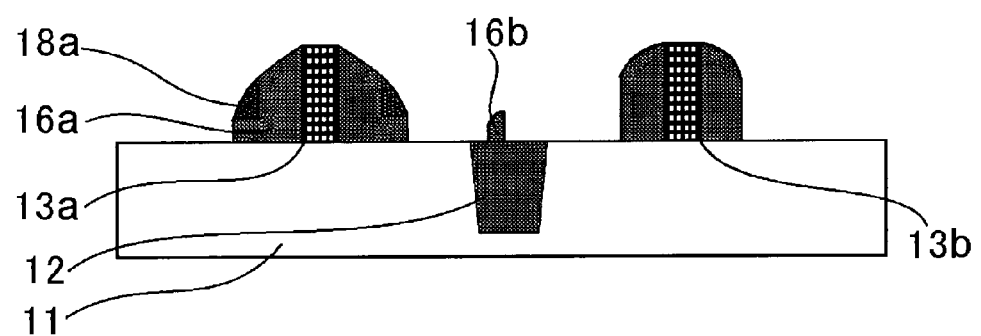
FIG. 8 is a cross-sectional view illustrating a process subsequent to FIG. 7.
Figure 9:
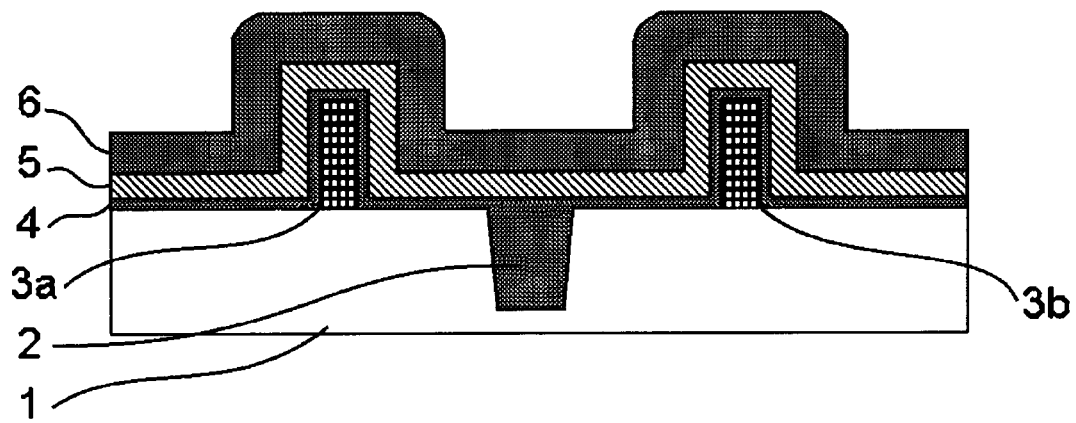
FIG. 9 is a cross-sectional view illustrating a method of manufacturing a semiconductor device disclosed in Japanese Unexamined patent publication NO. 2005-005508.
Figure 10:
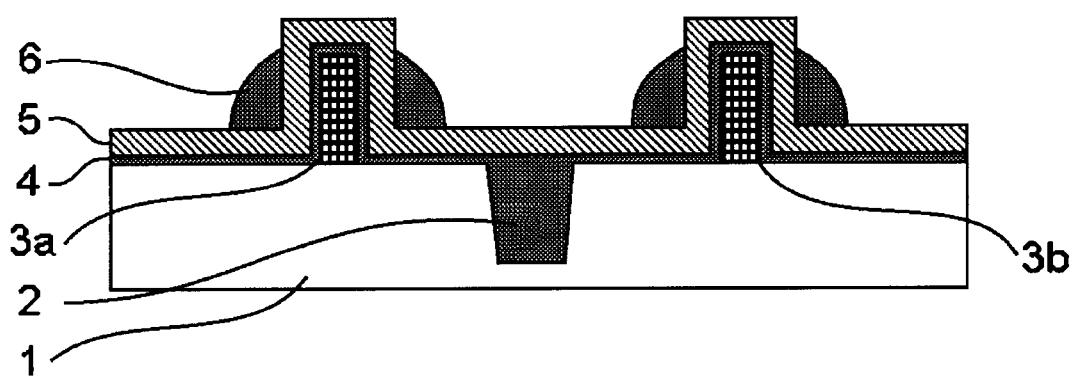
FIG. 10 is a cross-sectional view illustrating a process subsequent to FIG. 9.
Figure 11:
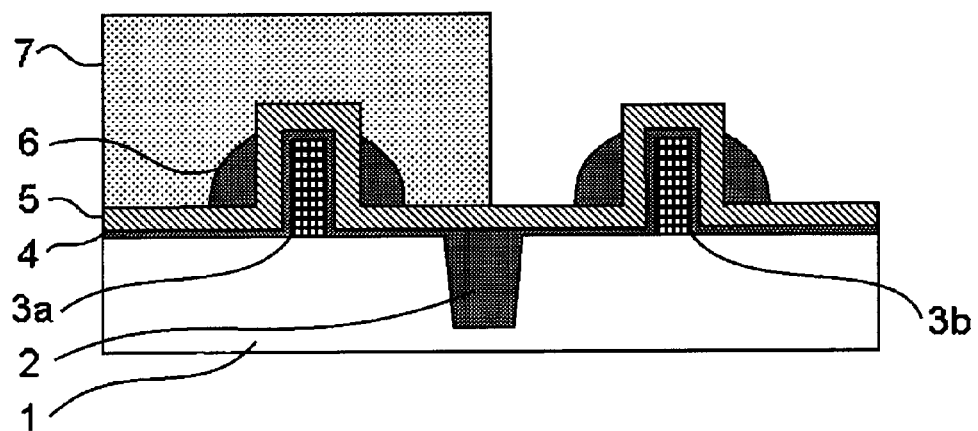
FIG. 11 is a cross-sectional view illustrating a process subsequent to FIG. 10.
Figure 12:
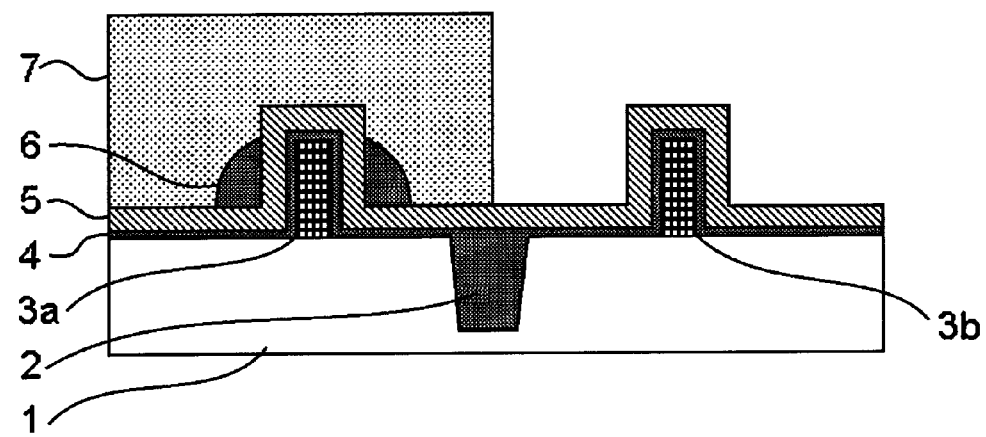
FIG. 12 is a cross-sectional view illustrating a process subsequent to FIG. 11.
Figure 13:
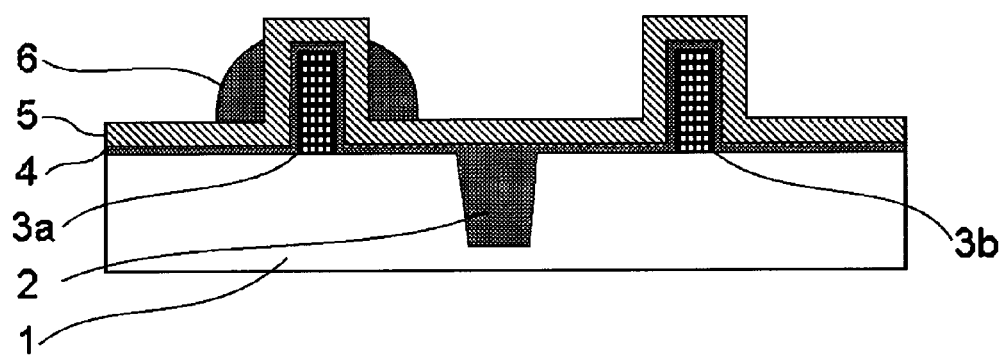
FIG. 13 is a cross-sectional view illustrating a process subsequent to FIG. 12.
Figure 14:
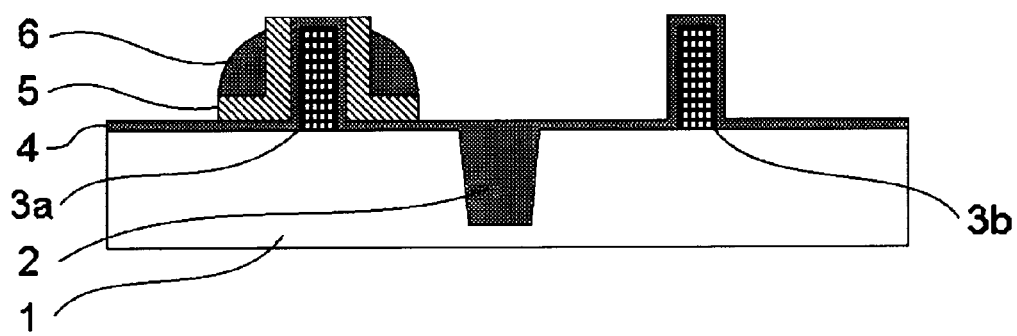
FIG. 14 is a cross-sectional view illustrating a process subsequent to FIG. 13.
Figure 15:
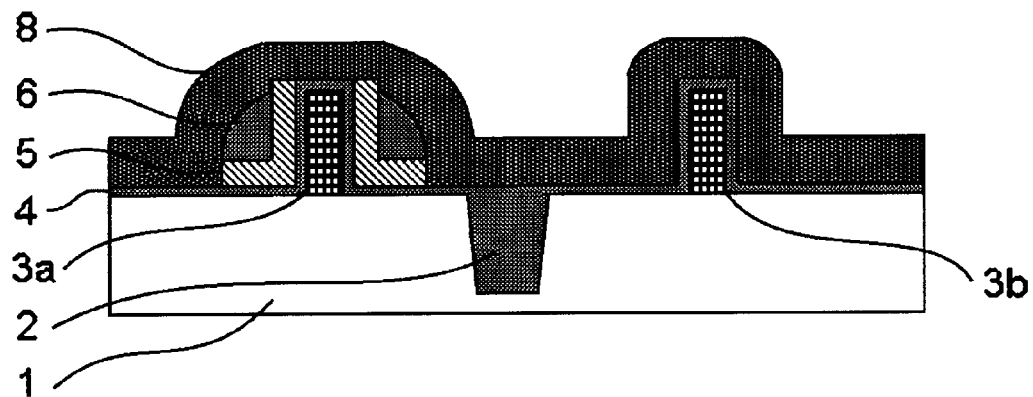
FIG. 15 is a cross-sectional view illustrating a process subsequent to FIG. 14.
Figure 16:
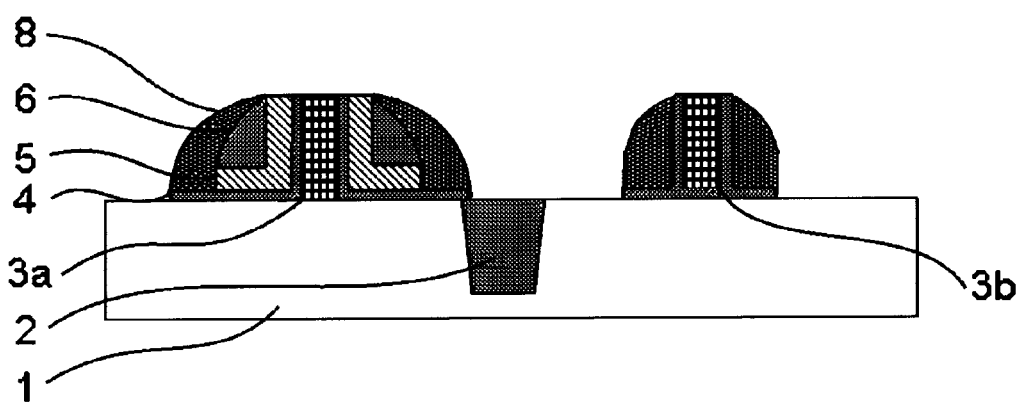
FIG. 16 is a cross-sectional view illustrating a process subsequent to FIG. 15.

Then, as shown in FIG. 8, anisotropic etching is performed on the first insulating film 16 to etch back the first insulating film 16. In this way, the second side wall spacer 16b is formed on the second gate electrode 13b. In addition, the third side wall spacer 16a is formed on the first gate electrode 13a. The third side wall spacer 16a is disposed inside the first side wall spacer 18a. The side wall spacer 18b is removed by the etching process.

That is, in this embodiment, the side wall spacer of the first gate electrode 13a includes the first side wall spacer 18a and the third side wall spacer 16a, and the side wall spacer of the second gate electrode 13b is the second side wall spacer 16b. Therefore, the width of the side wall spacer of the first gate electrode 13a may be greater than that of the side wall spacer of the second gate electrode 13b.

In this embodiment, the first insulating film 16, the etching stopper film 19, the resist pattern 17, and the second insulating film 18 may be formed in order to form the side wall spacers of the first gate electrode 13a and the second gate electrode 13b. Therefore, it is possible to reduce the number of films that need to be formed by the method disclosed in Japanese Unexamined patent publication NO. 2005-005508 and thus reduce the number of manufacturing processes.

When the second insulating film 18 is made of the same material as that forming the first insulating film 16 and the first insulating film 16 is etched back to form the second side wall spacer 16b and the third side wall spacer 16a, the first side wall spacer 18a is also etched back. Therefore, when the first side wall spacer 18a and the third side wall spacer 16a are regarded as one side wall spacer, it is possible to form a side wall spacer with an appropriate shape.

In the method disclosed in Japanese Unexamined patent publication NO. 2005-005508, when the side wall spacer layer 6 is etched, the outer layer of the silicon nitride film 5, which is an etching stopper film, is also removed. With the miniaturization of a semiconductor device, it is necessary to reduce the thickness of each layer in order to maintain the shape of the side wall spacer. When the thickness of the silicon nitride film 5 is reduced, pinholes are likely to be formed in the silicon nitride film 5 when the silicon oxide film 4 is etched. When the pinholes are formed in the silicon nitride film 5, the silicon oxide film 4 is removed during the etching of the side wall spacer layer 6. As a result, the semiconductor substrate 1 is damaged.

In contrast, in this embodiment, the etching stopper film 19 has no effect on the shape of the side wall spacer. Therefore, even though the semiconductor device is miniaturized, it is not necessary to reduce the thickness of each layer. As a result, it is possible to prevent the above-mentioned problems.

It is apparent that the present invention is not limited to the above embodiments, but may be modified and changed without departing from the scope and spirit of the invention.

What is claimed is:

1. A method of manufacturing a semiconductor device comprising:
    forming a first gate electrode of a first transistor and a second gate electrode of a second transistor over a semiconductor substrate, said first gate electrode and said second gate electrode each having a top surface opposite said semiconductor substrate;
    forming a first insulating film with a thickness that allows concave and convex portions formed due to said first gate electrode and said second gate electrode to remain, over said semiconductor substrate, said first gate electrode, and said second gate electrode, said first insulating film including a first portion which is over said second gate electrode including said top surface of said second gate electrode;
    forming over said first insulating film and said first portion an etching stopper film that covers said second gate electrode including said top surface of said second gate electrode, but does not cover said first gate electrode;
    forming a second insulating film with a thickness that allows concave and convex portions formed due to said first gate electrode to remain, over said first insulating film and said etching stopper film such that a portion of said second insulating film is over a portion of said etching stopper film which is over said first portion and over said top surface of said second gate electrode;
    performing anisotropic etching using said etching stopper film as a stopper to remove said second insulating film from over said second gate electrode, and forming a first side wall spacer of said first transistor;
    removing said etching stopper film; and
    performing anisotropic etching on said first insulating film to form a second side wall spacer over said second gate electrode and to form a third side wall spacer which is disposed inside said first side wall spacer of said first gate electrode.

2. The method of manufacturing a semiconductor device as set forth in claim 1, wherein said second insulating film is made of the same material as that forming said first insulating film.

3. The method of manufacturing a semiconductor device as set forth in claim 1,
    wherein said second insulating film is a silicon oxide film, and
    said etching stopper film is a silicon film, an amorphous carbon film, or a resist film.

4. The method of manufacturing a semiconductor device as set forth in claim 1,
    wherein said first transistor is part of a peripheral circuit that reads or writes data from or to a memory clement, and
    said second transistor is part of a logic circuit.

5. The method of manufacturing a semiconductor device as set forth in claim 1, wherein said removing said etching stopper film comprises isotropically etching said etching stopper film.

* * * * *